(12) United States Patent
Lim et al.

(10) Patent No.: US 9,668,377 B2
(45) Date of Patent: May 30, 2017

(54) STORAGE DEVICE

(71) Applicant: Samsung Electronics Co., Ltd., Gyeonggi-do (KR)

(72) Inventors: Gwang-Man Lim, Seoul (KR); Jae-bum Byun, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 542 days.

(21) Appl. No.: 13/942,858

(22) Filed: Jul. 16, 2013

(65) Prior Publication Data
US 2014/0022733 A1   Jan. 23, 2014

(30) Foreign Application Priority Data

Jul. 19, 2012 (KR) .................. 10-2012-0078954

(51) Int. Cl.
*H05K 7/20* (2006.01)
*H05K 1/02* (2006.01)

(52) U.S. Cl.
CPC ......... *H05K 7/2039* (2013.01); *H05K 1/0203* (2013.01); *H05K 7/20445* (2013.01)

(58) Field of Classification Search
CPC ...... G06F 1/20; H01L 23/473; H01L 2924/14
USPC ....... 361/688, 697, 703, 679.46, 679.54, 711
See application file for complete search history.

(56) References Cited

U.S. PATENT DOCUMENTS

| | | | |
|---|---|---|---|
| 6,049,469 A * | 4/2000 | Hood et al. | 361/818 |
| 6,605,778 B2 * | 8/2003 | Raith | H01L 23/367 174/524 |
| 7,042,727 B2 * | 5/2006 | Ulen | H01L 23/4006 165/80.3 |
| 7,078,800 B2 | 7/2006 | Kwon et al. | |
| 7,262,369 B1 * | 8/2007 | English | H01L 23/04 174/370 |
| 7,286,371 B2 * | 10/2007 | Unrein | H01L 23/4006 257/E23.084 |
| 7,312,998 B2 | 12/2007 | Kamemoto et al. | |
| 7,330,354 B2 * | 2/2008 | Watanabe | G06F 1/203 174/252 |
| 7,419,722 B2 | 9/2008 | Ohta et al. | |
| 7,546,943 B2 * | 6/2009 | Barina | B23K 37/0408 228/44.7 |
| 2002/0080577 A1 * | 6/2002 | Babcock et al. | 361/687 |

(Continued)

FOREIGN PATENT DOCUMENTS

| | | |
|---|---|---|
| JP | 2010-045325 | 2/2010 |
| JP | 2011-176079 | 9/2011 |

(Continued)

*Primary Examiner* — Robert J Hoffberg
*Assistant Examiner* — Hung Dang
(74) *Attorney, Agent, or Firm* — Myers Bigel, P.A.

(57) ABSTRACT

A storage device includes: a first semiconductor device mounted on a substrate; a housing accommodating the substrate, with the substrate fixed on a first fixing unit that is coupled to a first surface of the housing; and a first thermal conductive plate disposed between the first semiconductor device and the housing, with the first thermal conductive plate thermally connected to the housing, wherein the first thermal conductive plate has a thermal conductivity that is higher than that of the substrate. Thus, the storage device may dissipate heat generated by the semiconductor device rapidly to the outside or away from the storage device.

15 Claims, 10 Drawing Sheets

(56) References Cited

U.S. PATENT DOCUMENTS

| | | | |
|---|---|---|---|
| 2004/0136162 A1* | 7/2004 | Asai | H05K 1/0207 361/715 |
| 2010/0265675 A1 | 10/2010 | Aoki et al. | |
| 2011/0019356 A1 | 1/2011 | Moriai et al. | |
| 2011/0032679 A1 | 2/2011 | Baek et al. | |
| 2011/0257716 A1 | 10/2011 | Tiedtke | |
| 2011/0257795 A1 | 10/2011 | Narayanamurthy et al. | |

FOREIGN PATENT DOCUMENTS

| | | |
|---|---|---|
| KR | 1020100035494 | 4/2010 |
| KR | 1020100058168 | 6/2010 |

* cited by examiner

STORAGE DEVICE

CROSS-REFERENCE TO RELATED APPLICATIONS

This application claims the benefit of and priority from Korean Patent Application No. 10-2012-0078954, filed on Jul. 19, 2012, in the Korean Intellectual Property Office, the disclosure of which is incorporated by reference herein in its entirety.

FIELD

The inventive concept relates to a storage device, and more particularly, to a storage device capable of rapidly dissipating heat generated in a semiconductor device.

BACKGROUND

As small, light, and thin electronic devices have been developed, demands for high speed operation have increased. As a result of high speed operation for satisfying the demands, heat generated by each of semiconductor devices is increasing. In particular, a semiconductor device generating a lot of heat may negatively affect itself and/or other adjacent semiconductor devices, including causing the device(s) to operate improperly and/or become damaged, for example. Thus, the heat needs to be extinguished rapidly before negatively affecting the other semiconductor devices.

SUMMARY

According to an aspect of the inventive concept, there is provided a storage device including: a first semiconductor device mounted on a substrate; a housing accommodating the substrate, wherein the substrate is fixed on a first fixing unit that is coupled to a first surface of the housing; and a first thermal conductive plate disposed between the first semiconductor device and the housing, wherein the first thermal conductive plate is thermally connected to the housing, wherein at least a part of the first fixing unit and the first thermal conductive plate each have a thermal conductivity that is greater than a thermal conductivity of the substrate.

The first fixing unit may be formed of a material having a thermal conductivity that is greater than a thermal conductivity of the housing.

The first thermal conductive plate may be fixed on the first fixing unit in a spaced-apart relationship with the substrate.

The housing may further include a second fixing unit couple to a second surface of the housing that is different from the first surface of the housing, and the storage device may further include a second thermal conductive plate fixed on the second fixing unit. The second thermal conductive plate may be curved convexly toward the first thermal conductive plate. The housing may include: a first sub-housing comprising the first fixing unit; and a second sub-housing comprising the second fixing unit, wherein the second thermal conductive plate may elastically contact the first thermal conductive plate when the second sub-housing is coupled to the first sub-housing.

The storage device may further include: an electronic device electrically connected to the substrate; and a heat insulating pad disposed between the electronic device and the first thermal conductive plate. The housing may include: a first sub-housing comprising the first fixing unit; and a second sub-housing, wherein the storage device may further include a heat insulating interposer between at least a portion of the first sub-housing and the second sub-housing.

The housing may further include a second fixing unit coupled to a second surface of the housing that is different than the first surface of the housing, and the first thermal conductive plate may be coupled to the housing via the second fixing unit. The first fixing unit and the second fixing unit may be respectively located on opposite surfaces of the housing, and the first thermal conductive plate coupled to the housing by the second fixing unit may be curved convexly toward the first semiconductor device. The first thermal conductive plate that is curved may be configured to physically contact the first semiconductor device. The housing may include: a first sub-housing comprising the first fixing unit; and a second sub-housing comprising the second fixing unit, wherein the first thermal conductive plate may elastically contact the first semiconductor device when the second sub-housing is coupled to the first sub-housing. A plurality of the first semiconductor devices may be provided on the substrate, and a plurality of the first thermal conductive plates may be formed such that a respective one of the first thermal conductive plates elastically contacts a respective one of the plurality of the first semiconductor devices.

A second semiconductor device may be further mounted on the substrate, and the first thermal conductive plate may have an opening aligned with the second semiconductor device.

According to another aspect of the present inventive concept, there is provided a storage device including: a semiconductor device and an electronic device mounted on a substrate; a housing accommodating the substrate; a thermal conductor in thermal communication with the semiconductor device and the housing and configured to transfer heat generated by the semiconductor device to the housing; and a heat insulating feature configured to insulate the electronic device from heat generated by the semiconductor device.

In some embodiments, the thermal conductor comprises a thermally conductive plate coupled to the housing and a heat transfer medium disposed between the semiconductor device and the thermal plate, and the electronic device is spaced-apart from the thermally conductive plate to form the heat insulating feature. In some embodiments, the thermal conductor comprises a thermally conductive plate coupled to the housing, and the heat insulating feature comprises an opening in the thermally conductive plate that is aligned with the electronic device.

According to another aspect of the present inventive concept, a storage device includes: a semiconductor device and an electronic device disposed on a substrate; a housing holding the substrate therein, wherein the substrate is coupled to a first fixing unit that is coupled to a first surface of the housing; and a first thermally conductive plate disposed between the first semiconductor device and the housing, wherein the first thermally conductive plate is thermally connected to the housing, wherein the first thermally conductive plate is in thermal communication with the semiconductor device and configured to draw heat from the semiconductor device to the housing and away from the electronic device.

In some embodiments, the first thermally conductive plate is coupled to the first fixing unit in a spaced-apart relationship with the substrate, and wherein the first fixing unit comprises a plurality of fixing members disposed along a periphery of the first surface of the housing. In some embodiments, the first thermally conductive plate is coupled to a second fixing unit that is coupled to a second surface of the housing that is opposite the first surface of the housing, the second fixing unit comprising a plurality of fixing members, each fixing member disposed at a periphery of the second surface of the housing.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

Figure 1:
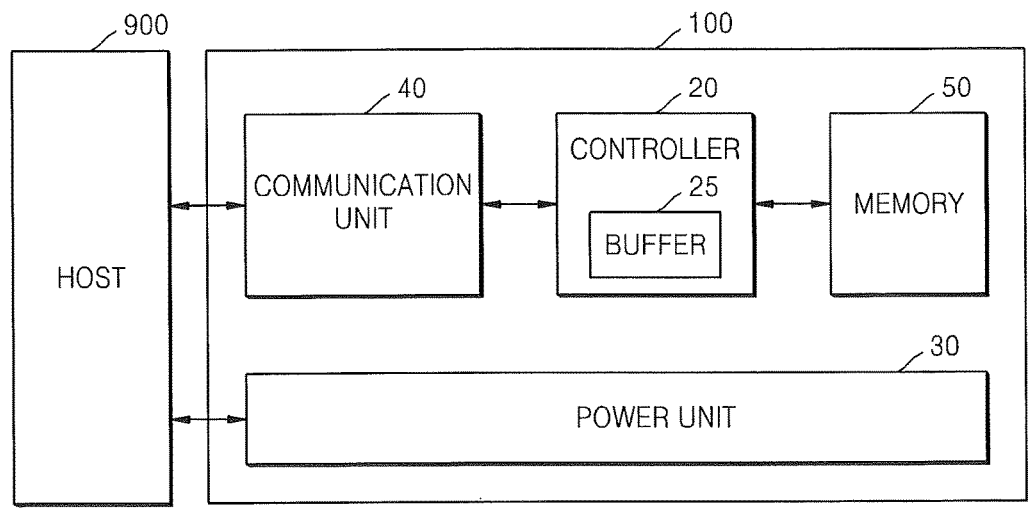
FIG. 1 is a conceptual view of a schematic structure of a storage device and a relationship of the storage device with an external host, according to some embodiments of the present inventive concept.

FIG. 1 is a conceptual view of a schematic structure of a storage device 100 according to an embodiment of the present inventive concept, and a relationship between the storage device 100 and an external host 900. The storage device 100 may include a controller 20, a power unit 30, a communication unit 40, and a memory 50.

The memory 50 may store data, and may include a storage device that maintains data even when electric power is not supplied thereto. The storage device 100 may be a non-volatile memory, for example, a flash memory, and/or a volatile memory, for example, a dynamic random access memory (DRAM) and/or a static random access memory (SRAM). The memory 50 may store or delete data according to a request of the controller 20, or may supply the stored data to the controller 20. The memory 50 may include one or more semiconductor chips. For example, the memory 50 may be formed as a multi-chip package (MCP) in which a plurality of semiconductor dies are stacked.

The controller 20 may control access to the data stored in the memory 50. That is, the controller 20 may control writing/reading operations of a memory device, for example, a flash memory, included in the memory 50 according to a control command input from the host 900. The controller 20 may be configured as an additional control semiconductor chip such as an application specific integrated circuit (ASIC), or may be a control program stored in a system domain of the memory 50. Also, the controller 20 may be configured as one control semiconductor chip with a part of the communication unit 40. The controller 20 may be designed to be automatically executed by an operating system of the host 900 when, for example, the storage device 100 is connected to the host 900. In this case, the controller 20 may include a script for automatic execution and an application program that may be executed in the host 900.

The controller 20 may further include a buffer 25. The buffer 25 may include a non-volatile memory that may be randomly accessed, for example, a DRAM, an SRAM, a synchronous dynamic random access memory (SDRAM), or a double data rate (DDR). By storing the data that is frequently used when the host 900 accesses the storage device 100 in the buffer 25, a time taken to read the data may be reduced. The buffer 25 may have a capacity of, for example, 8 Mbytes, 16 Mbytes, or 32 Mbytes. When the controller 20 is configured as an additional control semiconductor chip, the buffer 25 may be a part of the control semiconductor chip. Alternately, the buffer 25 may be an independent semiconductor chip. Alternately, the buffer 25 may be formed of a part of the semiconductor chip forming the memory 50 or a part of the semiconductor dies stacked in the stacked semiconductor package forming the memory 50.

The power unit 30 receives an electric power from the host 900 to supply the electric power to the controller 20, the communication unit 40, and the memory 50. The electric power supplied from the power unit 30 may be a direct current (DC) voltage of 3 V to about 12 V.

The communication unit 40 may transfer a power signal, as well as a data signal. In this case, components of the communication unit 40 may be driven by the electric power of the host 900 that is connected to the communication unit 40. Then, the power unit 30 may be omitted. The communication unit 40 may be, for example, an interface connecting a hard disk drive (HDD) to the host 900. In more detail, the communication unit 40 may include at least one of a serial advanced technology architecture (SATA) having a maximum speed of 1.5 Gb/s, a SATA2 having a maximum speed of 3 Gb/s, a SATA3 having a maximum speed of 6 Gb/s, eSATA, enhanced integrated drive electronics (E-IDE), small computer system interface (SCSI), SA-SCSI, zero insertion force (ZIF) type, compact flash (CF) type, universal serial bus (USB), and IEEE1394. However, the communication unit 40 is not limited thereto. The communication unit 40 includes power terminals to which the electric power is supplied from the host 900 and data terminals through which the data signals are input/output, and the power terminals and the data terminals may be formed in separate power socket and data socket or may be formed integrally in one socket.

The communication unit 40 may be configured to transmit/receive data via wireless signals, and in this case, a wireless communication module of the communication unit 40 may be activated or deactivated by the controller 20. In this case, the communication unit 40 may be connected to the host 900 through a wireless network.

The host 900 may be a device for transmitting/receiving information to/from the storage device 100, and may include an electronic device including a calculator, a memory, a controller, and/or an input/output unit. For example, the host 900 may be an electronic device such as a personal computer (PC), a server, a portable computer, a personal portable terminal, a mobile phone, an MP3 player, a navigation system, a portable multimedia player, a relay system, an access point (AP), other portable electronic devices, and electronic appliances that may transmit/receive data to/from peripheral electronic devices.

Figure 2A:
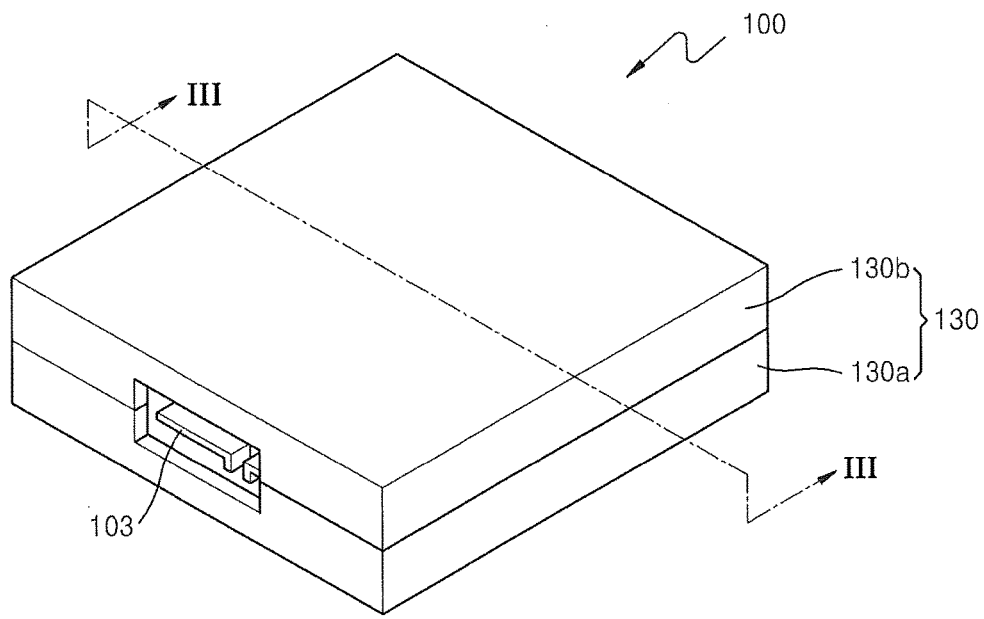
FIG. 2A is a perspective view of the storage device according to some embodiments of the present inventive concept.
Figure 2B:
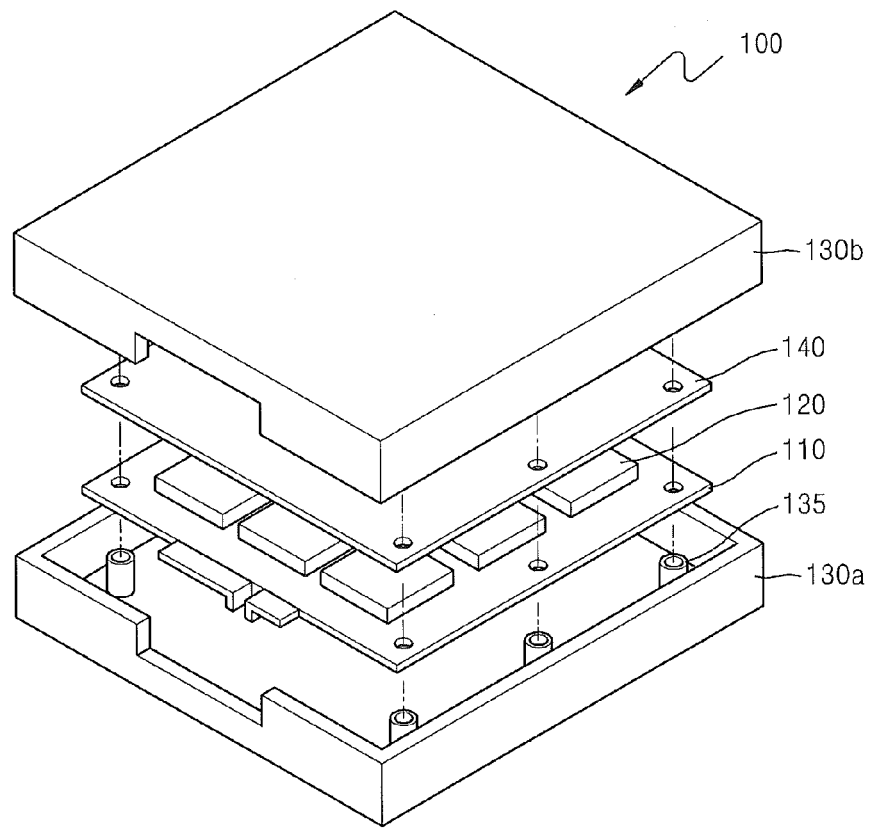
FIG. 2B is an exploded perspective view of the storage device of FIG. 2A.

FIG. 2A is a perspective view of the storage device 100 according to the present embodiment, and FIG. 2B is an exploded perspective view of the storage device 100.

Referring to FIGS. 2A and 2B, semiconductor devices 120 may be mounted on a substrate 110. The substrate 110 may be a printed circuit board (PCB) or a flexible PCB (FPCB).

The semiconductor devices 120 mounted on the substrate 110 may be controller chips for driving the storage device 100. Each of the controller chips may include the controller 20 that is described above.

Otherwise, the semiconductor devices 120 may be volatile memory devices or non-volatile memory devices. The volatile memory device may be a DRAM, an SRAM, an SDRAM, a DDR RAM, or an RDRAM; however, the present inventive concept is not limited thereto.

The non-volatile memory device may be, for example, a flash memory, a phase-change RAM (PRAM), a resistive RAM (RRAM), a ferroelectric RAM (FeRAM), or a magnetic RAM (MRAM); however, the present inventive concept is not limited thereto. The flash memory may be, for example, a NAND flash memory. Each of the non-volatile memory devices may be one semiconductor die, or a stacked structure of a plurality of semiconductor dies.

The semiconductor devices 120 may be mounted on the substrate in a ball grid array (BGA) type, a pin grid array (PGA) type, a tape carrier package (TCP) type, a chip-on-board (COB) type, a quad flat non-leaded (QFN) type, or a quad flat package (QFP) type. However, the present inventive concept is not limited thereto.

The substrate 110 on which the semiconductor devices 120 are mounted may be accommodated in a housing 130, and the housing 130 may include a first sub-housing 130a and a second sub-housing 130b. The housing 130 may be formed of a material that dissipates internal heat sufficiently and may have a strength for protecting the electronic components accommodated therein. In this point of view, the housing 130 may be formed of metal, for example, copper, tin, zinc, aluminum, or stainless steel; however, the present inventive concept is not limited thereto.

In FIGS. 2A and 2B, a boundary between the first sub-housing 130a and the second sub-housing 130b is located at a center portion in an up-and-down direction of the housing 130. However, the boundary between the first and second sub-housings 130a and 130b may be located at a lower surface or a lower portion of the housing 130. Otherwise, the boundary may be located at an upper surface or an upper portion of the housing 130.

The housing 130 may be thermally connected to first fixing unit(s) or member(s) 135 that may be used to fix the substrate 110 in place. Here, the thermal connection means that the housing 130 and the first fixing units 135 are connected to each other with or without another component intervening therebetween so that heat of the first fixing units 135 may be transferred to the housing 130 or vice versa.

In FIG. 2B, the first fixing unit 135 is a coupling boss; however, the present inventive concept is not limited thereto. As shown in FIG. 2B, the substrate 110 and a first thermal or thermally conductive plate 140 may include holes to which the first fixing units 135 may be coupled.

For example, the first fixing units 135 may be integrally formed with a lower plane of the housing 130, or may be separately formed from the lower plane of the housing 130. The first fixing units 135 may be formed of a material that is the same as the material forming the lower plane of the housing 130. For example, the substrate 110 and the first thermal conductive plate 140 may be coupled to the first fixing units 135 through screws.

In FIG. 2B, the first fixing units 135 are formed in the lower plane of the housing 130; however, the present inventive concept is not limited thereto. Also, FIGS. 2A and 2B show a SATA based interface 103 to the host; however, the present inventive concept is not limited thereto.

Figure 3:
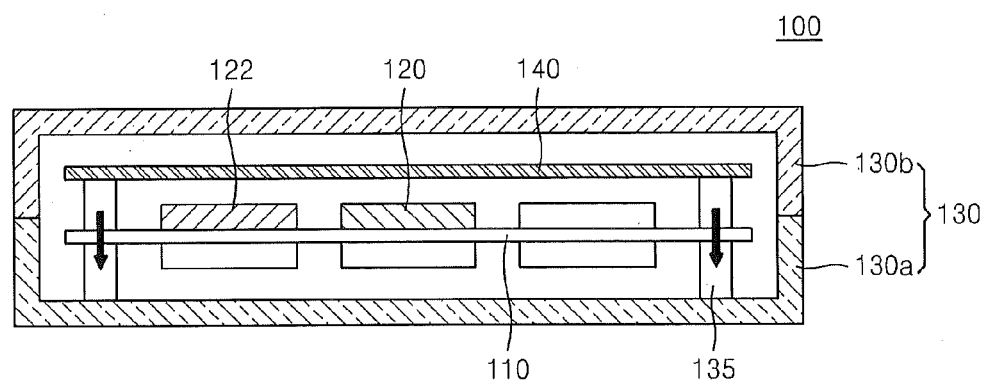
FIG. 3 is a cross-sectional view of the storage device taken along a line of FIG. 2A.

FIG. 3 is a cross-sectional view of the storage device 100 taken along a line III-III of FIG. 2A. Referring to FIG. 3, a first semiconductor device 120 may be mounted on the substrate 110. The first semiconductor device 120 may be, in particular, a device generating a lot of heat. For example, the first semiconductor device 120 may be a controller chip for driving the storage device 100. Otherwise, the first semiconductor device 120 may be a non-volatile memory chip. However, the first semiconductor device 120 is not limited to the above examples.

The substrate 110 is accommodated in the housing 130, and may be fixed on or connected to the first fixing units 135 that are thermally connected to the housing 130. The first fixing units 135 may be formed of the same material as that of the housing 130, or a material different from that of the housing 130.

The first thermal conductive plate 140 may be disposed between the first semiconductor device 120 and the housing 130. The first thermal conductive plate 140 may be formed of a material having a thermal conductivity that is higher than that of the substrate 110. For example, the first thermal conductive plate 140 may be formed of metal, a carbon-based material, or a combination thereof. For example, the metal may be copper (Cu), aluminum (Al), zinc (Zn), tin (Sn), or stainless steel; however, the present inventive concept is not limited thereto. The carbon-based material may be graphite, graphene, carbon-fiber, or carbon nanotube composite (CNT composite); however, the present inventive concept is not limited thereto. The first thermal conductive plate 140 may be fixed on the first fixing units 135 with the substrate 110.

The heat generated from the first semiconductor device 12Q may be transferred to the first thermal conductive plate 140 through convection or conduction. In FIG. 3, the first semiconductor device 120 and the first thermal conductive plate 140 are separated from each other; however, the first semiconductor device 120 and the first thermal conductive plate 140 may contact each other. When the first semiconductor device 120 and the first thermal conductive plate 140 are separated from each other, the heat may be transferred from the first semiconductor device 120 to the first thermal conductive plate 140 through convection of air therebetween. When the first semiconductor device 120 and the first thermal conductive plate 140 contact each other, the heat may be transferred from the first semiconductor device 120 to the first thermal conductive plate 140 through the conduction.

The heat transferred to the first thermal conductive plate 140 is transferred to the housing 130 via the first fixing units 135 as denoted by arrows in FIG. 3. At least a part of the first fixing units 135 may be formed of a material having a thermal conductivity that is higher than that of the first thermal conductive plate 140 in order to transfer the heat to the housing 130 rapidly.

A second semiconductor device 122 that generates less heat and is susceptible to or weak against heat transferred from outside may be mounted on the substrate 110. As described above, in a case where the second semiconductor device 122 that is weak against the heat is mounted adjacent to the first semiconductor device 120, the second semiconductor device 122 may malfunction due to the heat transferred through the substrate 110, and even worse, device defects of the second semiconductor device 122 may occur. Therefore, it is important to remove the heat generated by the first semiconductor device 120 via another path than the substrate 110 before the heat is transferred to the second semiconductor device 122 through the substrate 110.

Figure 4:
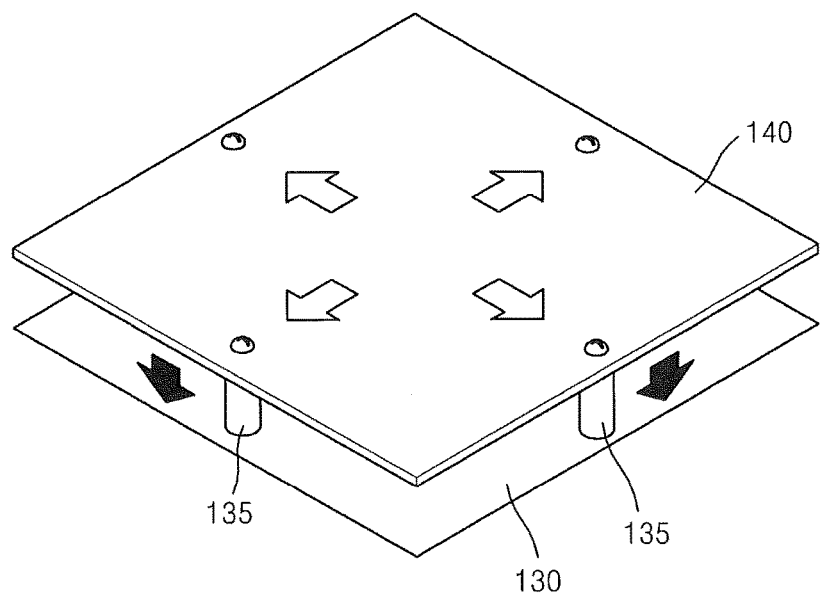
FIG. 4 is a perspective view showing a typical heat transfer path through a first heat conductive plate according to embodiments of the present inventive concept.

In this case, since the first thermal conductive plate 140 has the high thermal conductivity, the heat may be transferred rapidly in a horizontal direction, that is, a direction parallel with a main surface. In addition, the heat needs to be rapidly dissipated through the first fixing units 135 in order to discharge the heat through the first thermal conductive plate 140 rapidly and continuously. This will be described in more detail with reference to FIG. 4. FIG. 4 is a perspective view showing typical paths of transferring the heat through the first thermal conductive plate 140, and the first thermal conductive plate 140 and a housing 130' are partially shown.

Referring to FIG. 4, the heat transferred from the first semiconductor device 120 to the first thermal conductive plate 140 is transferred in the horizontal direction, and in particular, may be transferred toward the housing 130' through the first fixing units 135 along directions denoted by arrows. That is, the housing 130' may cool down the first fixing units 135 by the conduction, and accordingly, the first thermal conductive plate 140 may be rapidly cooled down. Thus, a temperature of the first semiconductor device 120 may be reduced without using the substrate 110, and accordingly, the transferring of the heat to the second semiconductor device 122 that is weak against the heat through the substrate 110 may be inhibited or prevented. As illustrated, in some embodiments, a plurality of fixing units or members 135 are disposed along and/or connected to a periphery of the housing 130' and/or the plate 140. The fixing units 135 may be generally evenly disposed along the periphery of the housing 130' and/or the plate 140 (e.g., one fixing member 135 at a center portion of each edge of the housing 130' and/or the plate 140) to encourage the heat transfer paths indicated by the arrows in FIG. 4.

Figure 5:
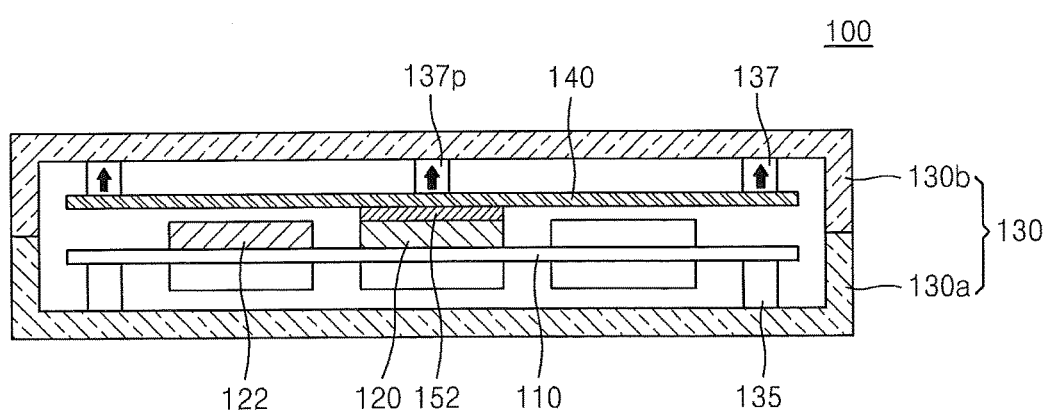
FIG. 5 is a cross-sectional view of a storage device according to another embodiment of the present inventive concept.

FIG. 5 is a cross-sectional view of a storage device 100 according to another embodiment of the present inventive concept.

Referring to FIG. 5, the substrate 110 on which the first semiconductor device 120 is mounted may be fixed on the first fixing units 135 of the housing 130. In addition, the second semiconductor device 122 that is weak against the heat may be further mounted on the substrate 110.

The first thermal conductive plate 140 may be further disposed between the first semiconductor device 120 and the housing 130. The first thermal conductive plate 140 may be fixed on the housing 130 via second fixing units or members 137. The second fixing units 137 may be formed on a surface where the first fixing units 135 are not formed. The housing 130 may include the first sub-housing 130a and the second sub-housing 130b. Here, side surfaces of the first sub-housing 130a and side surfaces of the second sub-housing 130b are considered as different surfaces from each other.

As shown in FIG. 5, the surface on which the first fixing units 135 are formed and the surface on which the second fixing units 137 are formed are different from each other, for example, the surfaces may face each other. Otherwise, at least one of the first and second fixing units 135 and 137 may be formed on a side surface of the housing 130. However, the present inventive concept is not limited thereto.

In the embodiment shown in FIG. 5, the first thermal conductive plate 140 is not fixed on the first fixing units 135, instead, the first thermal conductive plate 140 is fixed on the second fixing units 137, unlike the embodiment shown in FIG. 3. Thus, a distance between the first thermal conductive plate 140 and a surface of the housing 130 may be reduced, and accordingly, thermal transferring distances to an external surface of the housing 130, which is denoted by arrows, may be reduced. That is, the heat transferred to the first thermal conductive plate 140 is transferred to the housing 130 through the second fixing units 137 and dissipated. Here, since the second fixing units 137 may have lengths that are less than those of the first fixing units 135 shown in FIG. 3, the cooling operation may be enhanced.

Alternately, an additional second fixing unit 137p for fixing the first thermal conductive plate 140 may be disposed adjacent to the first semiconductor device 120 so that the heat transferred from the first semiconductor device 120 to the first thermal conductive plate 140 may be rapidly transferred to the external surface of the housing 130. In particular, the additional second fixing unit 137p may be disposed on a housing region overlapping with (e.g., aligned with) the first semiconductor device 120. With this configuration, the heat generated from the first semiconductor device 120 may be dissipated to outside through the additional second fixing unit 137p.

Otherwise, a thermal conductive medium 152 formed of a material having high thermal conductivity (e.g., excellent thermal conductivity) may be further disposed between the first semiconductor device 120 and the first thermal conductive plate 140. The material forming the thermal conductive medium 152 may include, for example, thermal grease, silicon oil, thermal interface material (TIM), and/or thermal pad. The thermal conductive medium 152 may not be necessarily solid, and may be formed of a material that is flexible and has high viscosity such as gel.

As described above, when the thermal conductive medium 152 is disposed between the first semiconductor device 120 and the first thermal conductive plate 140, the heat generated from the first semiconductor device 120 may be rapidly conducted to the first thermal conductive plate 140.

As described above, since the second semiconductor device 122 that is weak against the heat has to avoid the heat as much as possible, the thermal conductive medium 152 may not be disposed between the second semiconductor device 122 and the first thermal conductive plate 140.

In FIG. 5, the thermal conductive medium 152 is only disposed between the first semiconductor device 120 and the first thermal conductive plate 140; however, the thermal conductive medium 152 may be provided between the first thermal conductive plate 140 and an arbitrary semiconductor device that needs to dissipate heat rapidly.

Figure 6A:
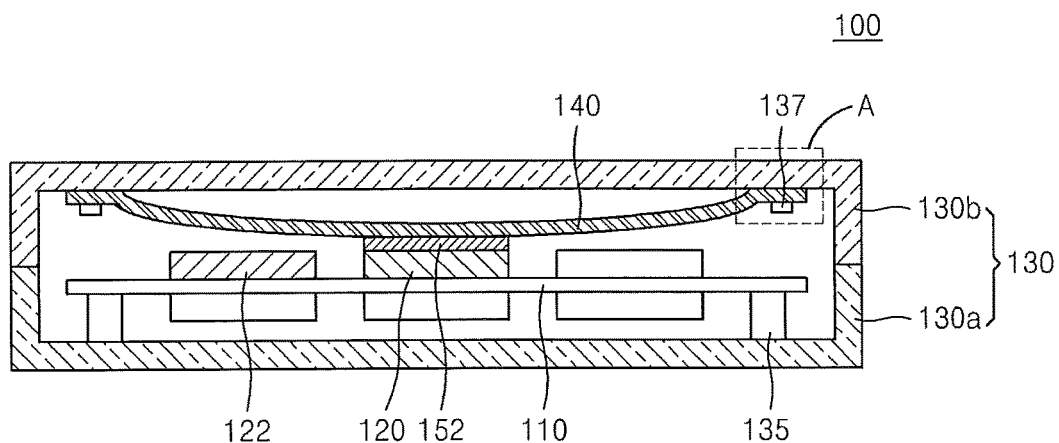
FIGS. 6A and 6B are cross-sectional views of a storage device according to other embodiments of the present inventive concept.
Figure 6B:
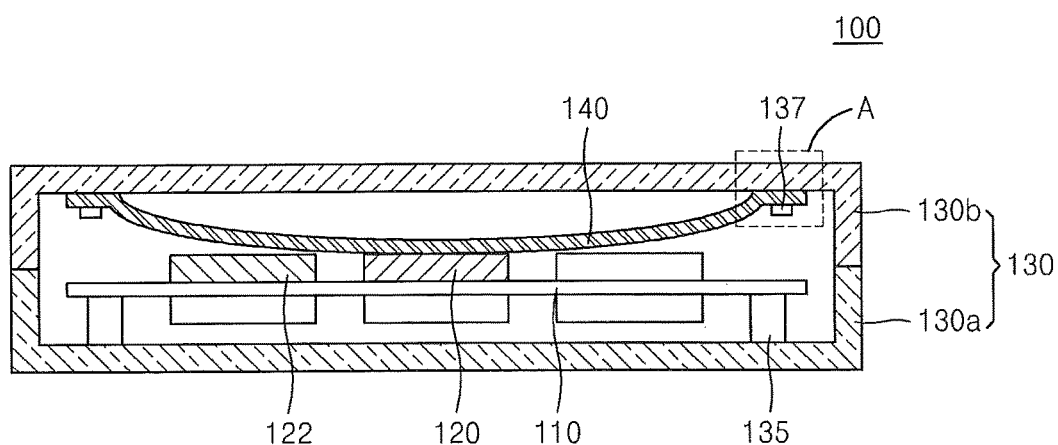

FIGS. 6A and 6B are cross-sectional views of the storage device 100 according to another embodiment of the present inventive concept.

Referring to FIG. 6A, the substrate 110 on which the first semiconductor device 120 is mounted may be fixed on the first fixing units 135 in the housing 130. According to the embodiment of FIG. 6A, the first thermal conductive plate 140 is disposed between the first semiconductor device 120 and the housing 130, wherein the first thermal conductive plate 140 may be curved to be convex toward the first semiconductor device 120. Here, the first thermal conductive plate 140 may be fixed by the second fixing units 137. As shown in FIG. 6A, the first thermal conductive plate 140 may contact the first semiconductor device 120 with the thermal conductive medium 152 interposed therebetween. Otherwise, as shown in FIG. 6B, the first thermal conductive plate 140 may directly contact the first semiconductor device 120.

Figure 6C:
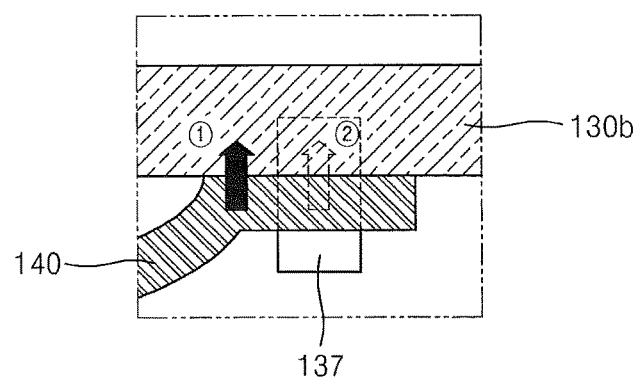
FIG. 6C is a partial diagram showing a portion A in FIGS. 6A and 6B.

In the embodiment shown in FIGS. 6A and 6B, the first thermal conductive plate 140 and the housing 130 may be fixed by the second fixing units 137 so as to directly contact each other. FIG. 6C is a partial view showing portion A of FIGS. 6A and 6B. Referring to FIG. 6C, the heat transferred from the first thermal conductive plate 140 may be transferred to the housing 130 across the surface where the first thermal conductive plate 140 and the housing 130 directly contact each other along a path denoted by an arrow 1. Also, the heat transferred from the first thermal conductive plate 140 may be transferred to the housing 130 through the second fixing unit 137 along a path denoted by an arrow 2. In this case, at least a part of the second fixing unit 137 may be formed of a material having a thermal conductivity that is higher than that of the material forming the first thermal conductive plate 140 in order to rapidly transfer the heat to the housing 130.

Figure 7:
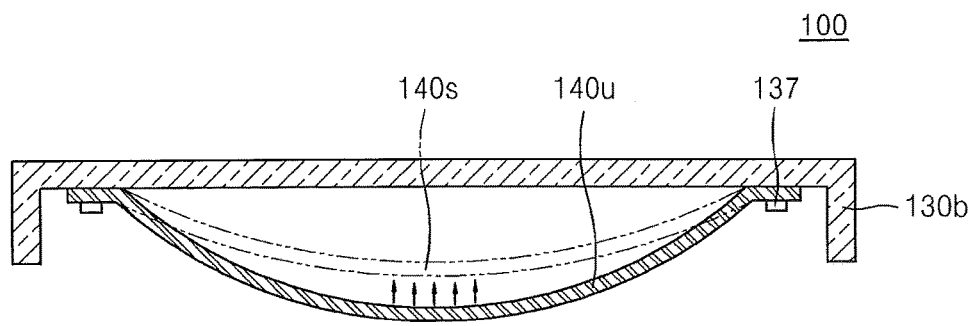
FIG. 7 is a diagram illustrating an elastic contact between a first heat transfer plate and a first semiconductor device according to embodiments of the present inventive concept.

In the embodiment shown in FIGS. 6A and 6B, the first thermal conductive plate 140 may elastically contact the first semiconductor device 120. FIG. 7 is a cross-sectional view to describe the elastic contact between the first thermal conductive plate 140 and the first semiconductor device 120. Referring to FIG. 7, the elastic contact between the first thermal conductive plate 140 and the first semiconductor device 120 represents that the first thermal conductive plate 140 is located at a location 140u when not contacting the first semiconductor device 120 and is strained to a location 140s when contacting the first semiconductor device 120. In particular, a degree of curvature of the first thermal conductive plate 140 may be adjusted so that the above strain is made when the first sub-housing 130a and the second sub-housing 130b are coupled to each other. Due to the above strain, elastic energy may be additionally accumulated in the first thermal conductive plate 140.

Figure 8:
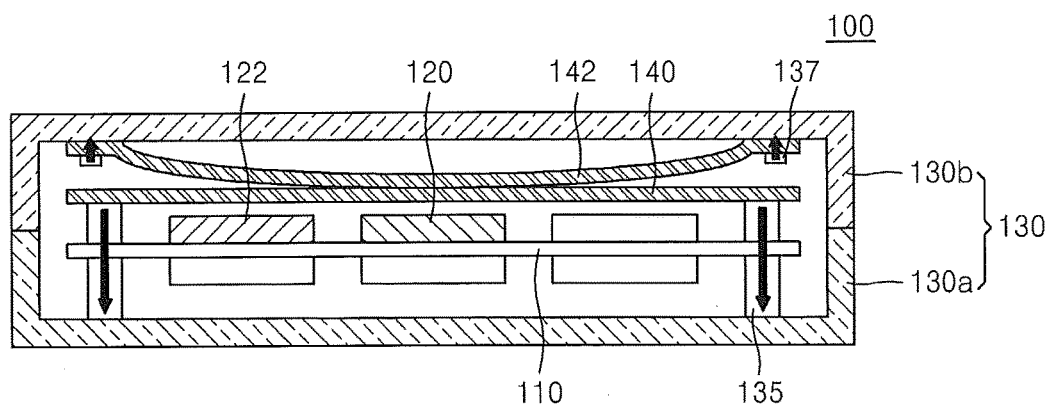
FIGS. 8 and 9 are side sectional views showing storage devices according to other embodiments of the present inventive concept.

FIG. 8 is a side sectional view of the storage device 100 according to another embodiment of the present inventive concept.

Referring to FIG. 8, the first semiconductor device 120 is mounted on the substrate 110 and the substrate 110 is accommodated in the housing, and the first thermal conductive plate 140 may be disposed between the first semiconductor device 120 and the housing 130 as shown in FIG. 3. The housing 130 may include the first sub-housing 130a including the first fixing units 135 and the second sub-housing 130b including the second fixing units 137. The substrate 110 may be fixed on the first fixing units 135, and the first thermal conductive plate 140 may be fixed on the first fixing units 135.

Also, the storage device 100 may further include a second thermal or thermally conductive plate 142 between the first thermal conductive plate 140 and the housing 130, and the second thermal conductive plate 142 may be fixed on the second fixing units 137. The second thermal conductive plate 142 may be curved convexly toward the first thermal conductive plate 140 as shown in FIG. 8. Moreover, the second thermal conductive plate 142 may be configured to directly contact the first thermal conductive plate 140 when the first sub-housing 130a and the second sub-housing 130b are coupled to each other.

According to the above configuration, the heat generated from the first semiconductor device 120 may be transferred to the first thermal conductive plate 140 through conduction or convection, and then, may be transferred to the first sub-housing 130a through the first fixing units 135 as described with reference to FIG. 3. Also, some of the heat generated from the first semiconductor device 120 may be transferred to the first thermal conductive plate 140, and after that, may be conducted toward the second thermal conductive plate 142. The heat transferred toward the second thermal conductive plate 142 may be transferred to the second sub-housing 130b through the second fixing units 137 on which the second thermal conductive plate 142 is fixed. Therefore, the two opposite sides of the hosing 130 may be used to dissipate heat.

Figure 9:
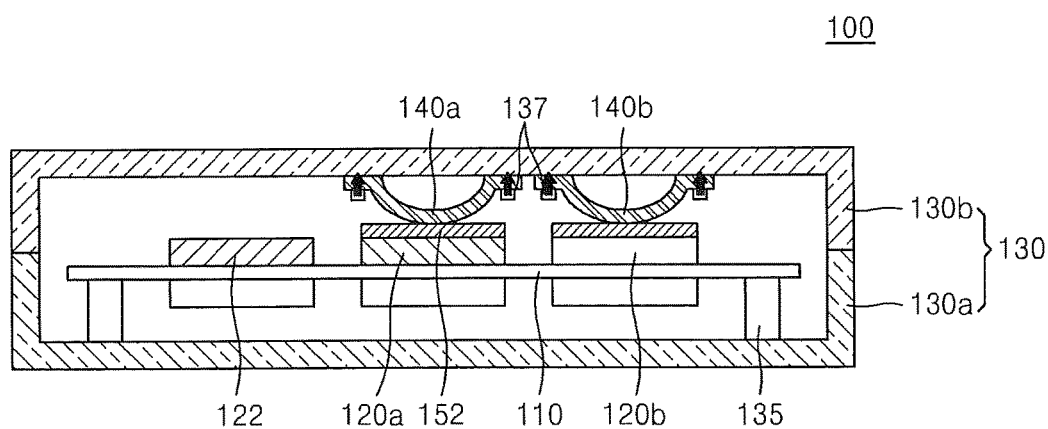

FIG. 9 is a side sectional view of the storage device 100 according to another embodiment of the present inventive concept.

Referring to FIG. 9, the storage device 100 is different from that of FIG. 6A in that the storage device 100 of the present embodiment includes a plurality of first thermal conductive plates 140a and 140b. In the embodiment of FIG. 9, a plurality of first semiconductor devices 120a and 120b generating a lot of heat are provided, and the plurality of first conductive plates 140a and 140b may correspond respectively to the first semiconductor devices 120a and 120b. That is, the number of the first semiconductor devices 120a and 120b and the number of the first thermal conductive plates 140a and 140b may be equal to each other, and then, the first thermal conductive plates 140a and 140b may be connected to the housing 130 via the second fixing units 137. In a case of a solid state drive (SSD), conventionally only the controller chip including the controller generates a lot of heat, and thus, it may be sufficient that one semiconductor device is intensively cooled down. However, recently many semiconductor devices have been generating a lot of heat that may cause several problems, and thus, a method of cooling down a plurality of semiconductor devices should be considered.

According to the embodiment of FIG. 9, the plurality of first thermal conductive plates 140a and 140b are formed to actively dissipate the heat from the semiconductor devices that need to be dissipated rapidly. If only one first thermal conductive plate 140 is formed like in the embodiment shown in FIG. 6A, the semiconductor device generating the most heat or the semiconductor device disposed on a center portion in a horizontal direction of the substrate 110 may only be cooled down.

Figure 10A:
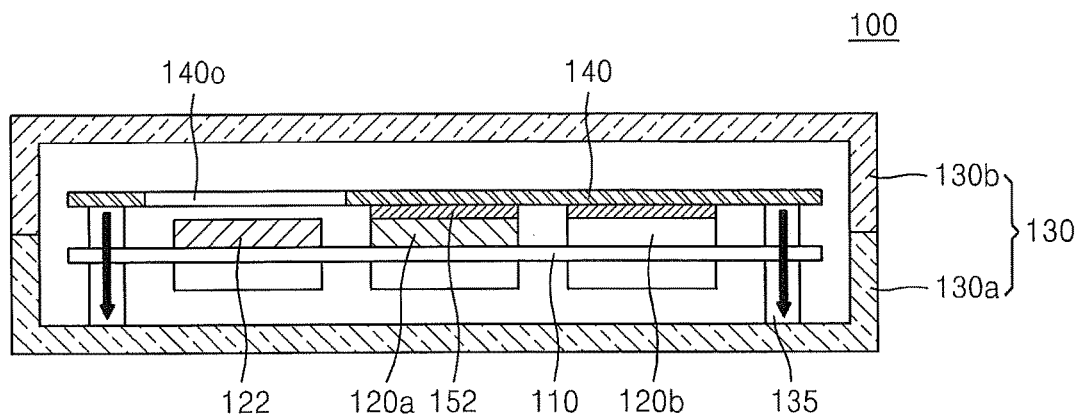
FIG. 10A is a side sectional view of a storage device according to other embodiments of the present inventive concept.
Figure 10B:
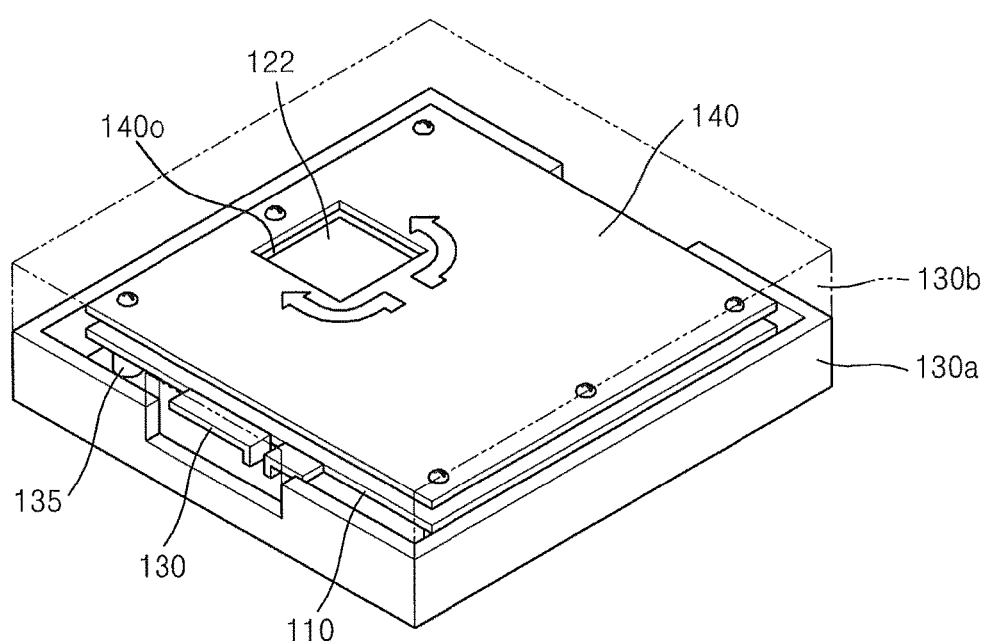
FIG. 10B is a partially transparent perspective view illustrating a second sub-housing of the storage device shown in FIG. 10A.

FIG. 10A is a side sectional view of the storage device 100 according to another embodiment of the present invention, and FIG. 10B is a projective perspective view showing the second sub-housing 130b.

Referring to FIG. 10A, the first thermal conductive plate 140 may include an opening 140o generally aligned with the second semiconductor device 122 so that the plate 140 does not overlap with the second semiconductor device 122 that is mounted on the substrate 110 and is susceptible to or weak against the heat. As shown in FIG. 10B, since the second semiconductor device 122 does not overlap with the first thermal conductive plate 140 due to the opening 140o, the heat transferred to the first thermal conductive plate 140 from the other semiconductor devices may not be transferred toward the second semiconductor device 122. That is, the heat transferred from the first semiconductor device 120 generating a lot of heat is transferred to other directions as denoted by the arrows of FIG. 10B while detouring the opening 140o, and thus, the heat does not affect or minimally affects the second semiconductor device 122.

Figure 11:
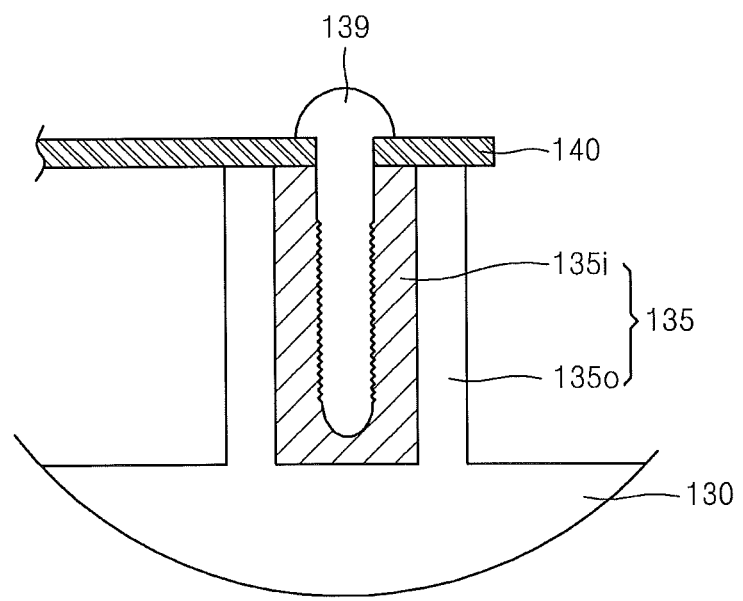
FIG. 11 is a partial cross-sectional view of a first fixing unit according to some embodiments of the present inventive concept.

FIG. 11 is a partial cross-sectional view showing the first fixing unit 135.

Referring to FIG. 11, the first fixing unit 135 may include a heat transferring medium 135i formed of a material having a thermal conductivity that is higher than that of the material forming the housing 130. In FIG. 11, the first fixing unit 135 is formed to have a cylindrical boss structure, and an outer circumferential portion 135o of the first fixing unit 135 may be formed of the same material as that of the surface of the housing 130. Also, the heat transferring medium 135i formed in the first fixing unit 135 may be formed of a material having higher thermal conductivity than that of the housing 130. For example, the heat transferring medium 135i may be formed of TIM, metal such as Cu, Al, and Ag, a carbon-based material such as graphite, graphene, carbon-fiber, and carbon nanotube composite, or a combination thereof.

In FIG. 11, the heat transferring medium 135i is shown as a part of the first fixing unit 135; however, entire portion of the first fixing unit 135 may be the heat transferring medium 135i. Also, in FIG. 11, the first fixing unit 135 is formed as a boss in which the heat 'transferring medium 135i is disposed; however, the present inventive concept is not limited thereto. For example, the first fixing unit 135 may be a fixing unit using another coupling manner than the boss-screw coupling, for example, contact type coupling, rivet coupling, adhesion coupling, bolt-nut coupling, and fusion-bonding coupling. In addition, the heat transferring medium 135i is not necessarily disposed in the first fixing unit 135 provided that at least a part of the first fixing unit 135 is the heat transferring medium 135i.

In FIG. 11, the first thermal conductive plate 140 is coupled to the first fixing unit 135. The heat transferred via the first thermal conductive plate 140 is transferred to the heat transferring medium 135i also via a fastener 139 (e.g., screw). Since the heat transferring medium 135i has high thermal conductivity, the heat may be rapidly transferred to the outer circumferential portion 135o or the lower plane of the housing 130, thereby dissipating the heat rapidly to outside.

Figure 12:
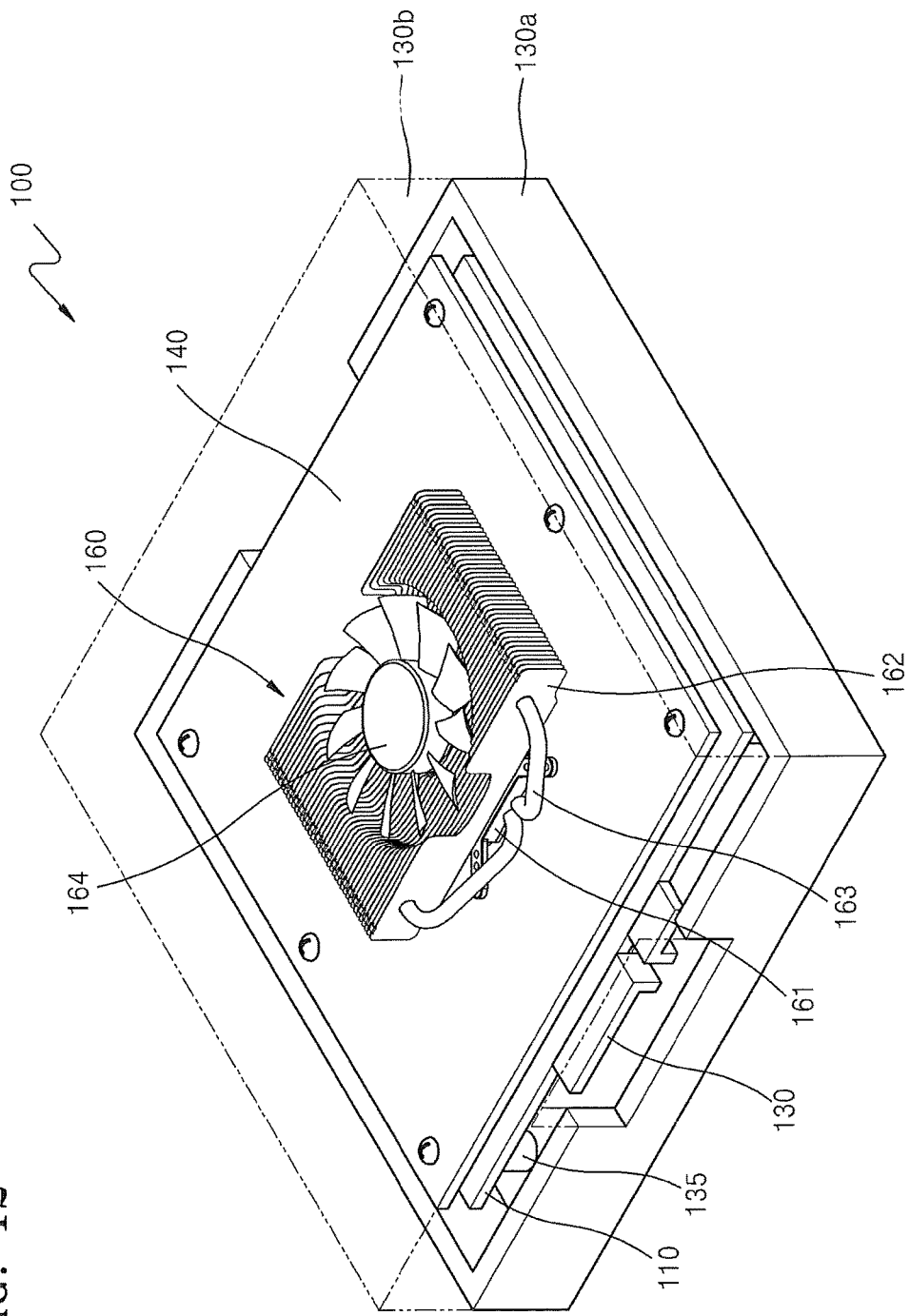
FIG. 12 is a perspective view of a storage device according to other embodiments of the present inventive concept.

FIG. 12 is a perspective view of the storage device 100 according to another embodiment of the present inventive concept.

Referring to FIG. 12, the storage device 100 may further include a heat dissipation structure 160 on the first thermal conductive plate 140. In FIG. 12, the heat dissipation structure 160 includes heat pipes; however, the present inventive concept is not limited thereto. The heat dissipation structure 160 may be, for example, a fin.

The heat dissipation structure 160 disposed on the first thermal conductive plate 140 contacts the first thermal conductive plate 140 to cool down the first thermal conductive plate 140, and includes a heat transferring block 161, a plurality of heat dissipation fins 162, heat pipes 163, and a cooling fan 164. The heat transferring block 161 is coupled to the first thermal conductive plate 140 so as to remove the heat transferred from the semiconductor device to the first thermal conductive plate 140. The heat transferring block 161 may be formed of metal having an excellent thermal conductivity, for example, Cu, Al, or an alloy thereof. A material such as thermal grease may be disposed between the heat transferring block 161 and the first thermal conductive plate 140 in order to accelerate the heat transfer between these two components.

The plurality of heat dissipation fins 162 are located above the heat transferring block 161, and are spaced apart from each other in a direction. Each of the heat dissipation fins 162 may be a thin plate formed of metal having excellent thermal conductivity, for example, Cu, Al, or an alloy thereof. The heat dissipation fins 162 may be disposed perpendicularly to an upper surface of the heat transferring block 161. The heat dissipation fins 162 may directly contact the heat transferring block 161, or may be separated from the heat transferring block 161.

An end portion of the heat pipe 163 is coupled to the heat transferring block 161, and the other end portion of the heat pipe 163 may be coupled to the heat dissipation fins 162. The heat pipe 163 penetrates through the plurality of heat dissipation fins 162 to couple them to each other. The heat pipe 163 may be coupled to the heat transferring block 161 so as to transfer the heat of the heat transferring block 161 to the heat dissipation fins 162.

The cooling fan 164 may be disposed on an upper portion, a center portion, or a lower portion of the heat dissipation fins 162. In FIG. 12, the cooling fan 164 is disposed throughout the upper and center portions of the heat dissipation fins 162; however, the present inventive concept is not limited thereto.

Figure 13:
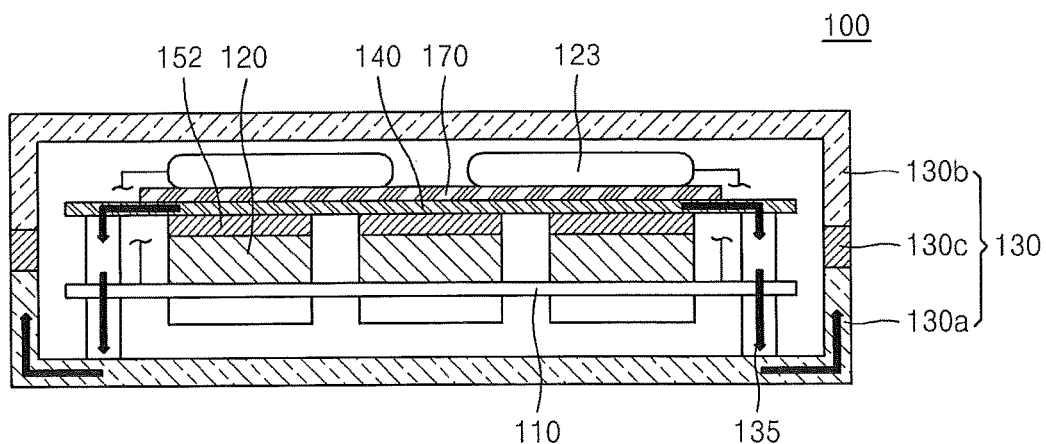
FIGS. 13 and 14 are side sectional views of a storage device according to other embodiments of the present inventive concept.

FIG. 13 is a side sectional view of the storage device 100 according to another embodiment of the present inventive concept.

Referring to FIG. 13, the first semiconductor device 120 is mounted on the substrate 110 like in FIG. 3, and they are accommodated in the housing 130. The first semiconductor device 120 may be a device generating a lot of heat that needs to be dissipated rapidly. The housing 130 may include the first sub-housing 130a, the second sub-housing 130b, and a heat insulating interposer 130c that may substantially block the heat transfer between the first and second sub-housings 130a and 130b. Also, the first sub-housing 130a may include the first fixing units 135. The substrate 110 may be fixed on the first fixing units 135.

As shown in FIG. 13, the first thermal conductive plate 140 may be disposed on the first semiconductor device 120, and the first thermal conductive plate 140 may be fixed on the first fixing units 135. In addition, the first semiconductor device 120 may contact the first thermal conductive plate 140 in order to transfer the heat generated from the first semiconductor device 120 rapidly to the first thermal conductive plate 140. Alternately, the first semiconductor device 120 may contact the first thermal conductive plate 140 via the heat transferring medium 152. According to the above configuration, the heat generated from the first semiconductor device 120 is transferred to the first thermal conductive plate 140, and after that, is transferred to the first sub-housing 130a along directions denoted by arrows through the first fixing units 135.

Meanwhile, the storage device 100 may further include an electronic device 123 that is susceptible to or weak against the heat, for example, a super capacitor, and in particular, such device may be disposed on the first semiconductor device 120 to be electrically connected to the substrate 110 for realizing a compact structure. As shown in FIG. 13, the electronic device 123 that is weak against the heat may be adjacent or close to the first thermal conductive plate 140. Here, a heat insulating pad 170 may be further disposed between the first thermal conductive plate 140 and the electronic device 123 in order to inhibit or prevent the heat that has to be dissipated to outside through the first fixing unit 135 from being transferred to the electronic device 123 that is weak against the heat.

The heat insulating pad 170 may be formed of a material having a low thermal conductivity such as an epoxy-based polyurethane, aerogel material, Teflon, Mica, or a composite thereof. The heat insulating pad 170 may be a stacked body in which the above materials are selectively stacked. The rate of transferring the heat generated from the first semiconductor device 120 to the electronic device 123 may be reduced due to the heat insulating pad 170. Otherwise, transfer of the heat generated from the first semiconductor device 120 to the electronic device 123 may be blocked or substantially blocked by the heat insulating pad 170.

Through the above configuration, the heat generated from the first semiconductor device 120 may not be transferred to the electronic device 123 via the first thermal conductive plate 140, but transferred to the outside through the first fixing units 135.

Optionally, a heat insulating interposer or spacer 130c may be further disposed between the first sub-housing 130a and the second sub-housing 130b so that the heat transferred to the first sub-housing 130a through the first fixing units 135 may not be transferred to the second sub-housing 130b that is adjacent to the electronic device 123 weak against the heat. The heat insulating interposer 130c may be formed of the material having a low thermal conductivity such as an epoxy-based polyurethane, aerogel material, Teflon, Mica, or a composite thereof.

Figure 14:
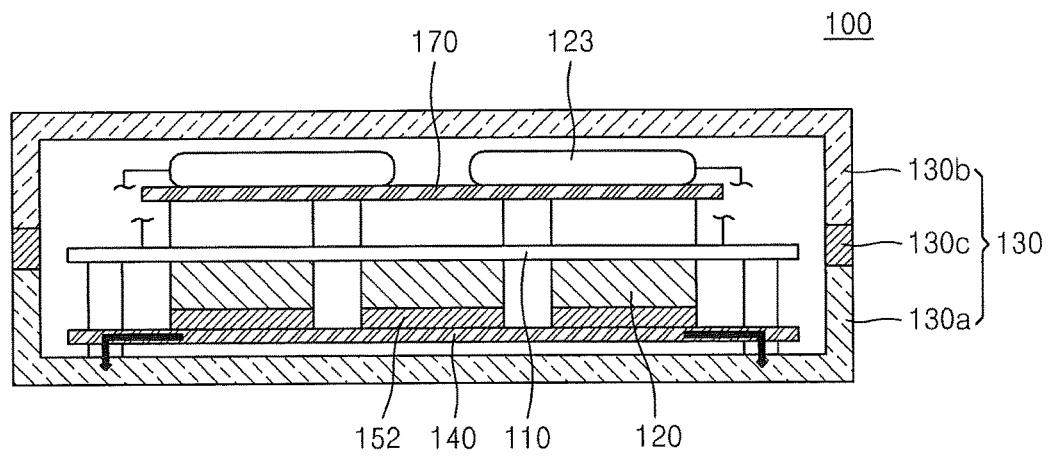

FIG. 14 is a side sectional view of the storage device 100 according to another embodiment of the present invention.

Referring to FIG. 14, the first semiconductor device 120 is mounted on the substrate 110 like in FIG. 13, and they are accommodated in the housing 130. Since the first semiconductor device 120 and the housing 130 are described in detail with reference to FIG. 13, detailed descriptions thereof are not provided here. However, the first semiconductor device 120 may be mounted on a side of the substrate 110 to be adjacent to the first sub-housing 130a.

The first thermal conductive plate 140 may be disposed between the first semiconductor device 120 and the first sub-housing 130a, and the first substrate 110 and the first thermal conductive plate 140 may be fixed on the first sub-housing 130a via the first fixing unit 135. According to the above configuration, since the distance between the first thermal conductive plate 140 and the first sub-housing 130a may be significantly reduced, a heat transferring distance through the first fixing unit 135a is reduced, thereby dissipating the heat to the outside more easily.

Also, the storage device 100 may further include the electronic device 123 that is susceptible to or weak against the heat on an opposite side of the substrate 110 from the first semiconductor device 120. When comparing this with the example of FIG. 13, since a distance between the electronic device 123 that is weak against the heat and the first semiconductor device 120 generating a lot of heat is increased, the electronic device 123 may be better protected. Alternately, if the increase in the distance may not be sufficient to protect the electronic device 123, the heat insulating pad 170 may be further disposed between the electronic device 123 and the substrate 110. Although not shown in FIG. 14, the heat insulating pad 170 may be fixed on the first fixing units 135 with the substrate 110.

Figure 15:
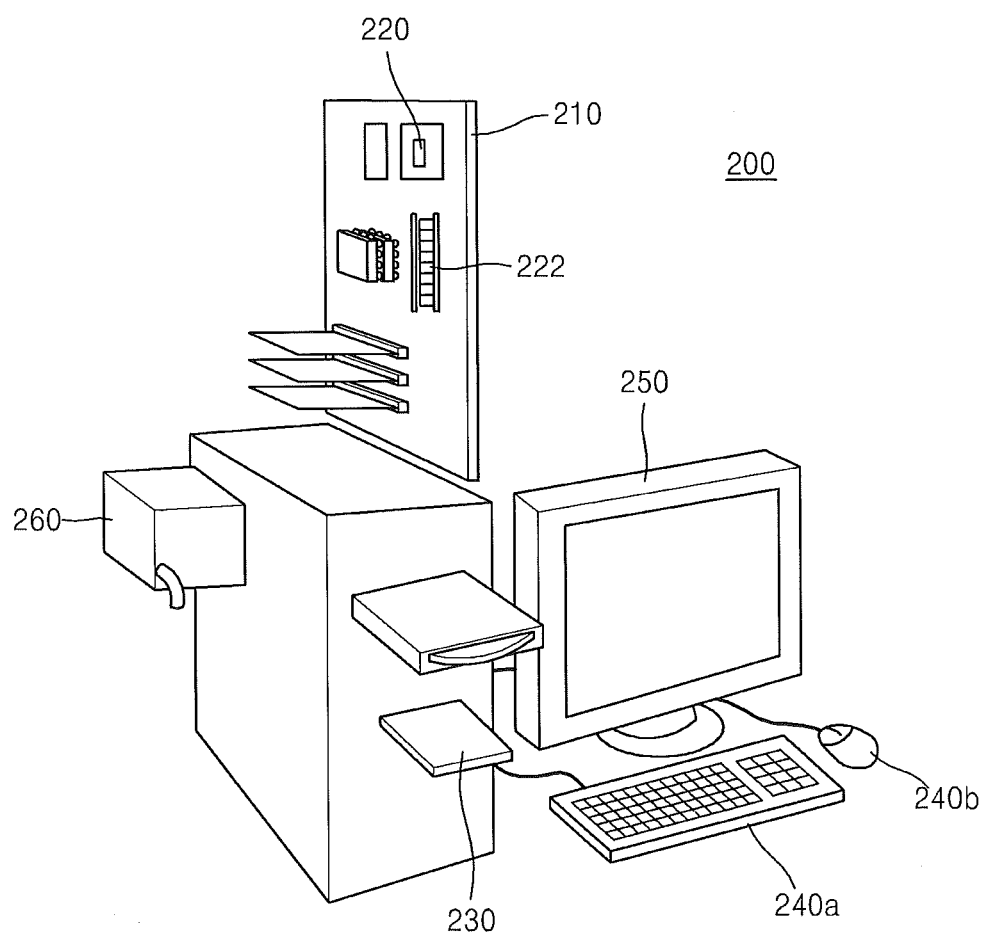
FIG. 15 is a conceptual view of a system according to some embodiments of the present inventive concept.

FIG. 15 is a conceptual view of a system 200 according to an embodiment of the present inventive concept.

Referring to FIG. 15, the system 200 includes a main board 210, a central processing unit (CPU) 220 mounted on the main board 210, an auxiliary storage device 230, input devices 240a and 240b, and an output device 250. The auxiliary storage device 230 may be one of the above described storage devices.

The input devices 240a and 240b each may be a keyboard, a mouse, or a touch screen; however, the present inventive concept is not limited thereto. The input devices 240a and 240b are devices for inputting data in the CPU 220. The output device 250 may be a monitor or a printer; however, the present inventive concept is not limited thereto. The output device 250 may be a device for outputting data from the CPU 220. The input and output devices 240a, 240b, and 250 may be integrated as a device.

The CPU 220 and a main storage device 222 may be mounted on the main board 210. The main storage device 222 may be, for example, a RAM module such as a DRAM.

Also, the main board 210 may be configured so that a video card or a communication card may be further mounted thereon. In addition, the main board 210 may be configured to exchange information with the auxiliary storage device 230 by using a communication standard such as SATA or SATA-II.

Also, the system 200 includes a power supply device 260 to supply electric power to the main board 210, etc.

The system 200 may be a desktop personal computer (PC), a laptop computer, a smart phone, a tablet PC, a portable multimedia player (PMP), a navigation system, or a flat panel display apparatus such as a flat panel television.

While the inventive concept has been particularly shown and described with reference to exemplary embodiments thereof, it will be understood that various changes in form and details may be made therein without departing from the spirit and scope of the following claims.

What is claimed is:

1. A storage device comprising:
   a first semiconductor device mounted on a substrate;
   a housing accommodating the substrate, wherein the substrate is fixed on a first fixing unit that is directly coupled to a first surface of the housing; and
   a first thermal conductive plate disposed between the first semiconductor device and the housing, wherein the first thermal conductive plate is thermally connected to the housing,
   wherein at least a part of the first fixing unit and the first thermal conductive plate each have a thermal conductivity that is greater than a thermal conductivity of the substrate,
   wherein the first thermal conductive plate is spaced apart from the substrate,
   wherein the housing further comprises a second fixing unit coupled to a second surface of the housing that is different than the first surface of the housing, wherein the first thermal conductive plate is coupled to the housing via the second fixing unit, and wherein at least a major portion of the first thermal conductive plate is spaced apart from the second surface of the housing.

2. The storage device of claim 1, wherein the first fixing unit is formed of a material having a thermal conductivity that is greater than a thermal conductivity of the housing.

3. The storage device of claim 1, further comprising:
   an electronic device electrically connected to the substrate; and
   a heat insulating pad disposed between the electronic device and the first thermal conductive plate.

4. The storage device of claim 1, wherein the first fixing unit and the second fixing unit are respectively located on opposite surfaces of the housing, and the first thermal conductive plate coupled to the housing by the second fixing unit is curved convexly toward the first semiconductor device.

5. The storage device of claim 1, wherein a second semiconductor device is further mounted on the substrate, and the first thermal conductive plate has an opening aligned with the second semiconductor device.

6. The storage device of claim 1, wherein the first fixing unit comprises a plurality of spaced-apart fixing members.

7. The storage device of claim 3, wherein the housing comprises:
   a first sub-housing comprising the first fixing unit; and
   a second sub-housing,
   wherein the housing further comprises a heat insulating interposer between at least a portion of the first sub-housing and the second sub-housing.

8. The storage device of claim 4, wherein the first thermal conductive plate that is curved is configured to physically contact the first semiconductor device.

9. The storage device of claim 8, wherein the housing comprises:
   a first sub-housing comprising the first fixing unit; and
   a second sub-housing comprising the second fixing unit,
   wherein the first thermal conductive plate elastically contacts the first semiconductor device when the second sub-housing is coupled to the first sub-housing.

10. The storage device of claim 9, wherein a plurality of the first semiconductor devices are provided on the substrate, and a plurality of the first thermal conductive plates are formed such that a respective one of the first thermal conductive plates elastically contacts a respective one of the plurality of the first semiconductor devices.

11. A storage device comprising:
    a first semiconductor device mounted on a substrate;
    a housing accommodating the substrate, wherein the substrate is fixed on a first fixing unit that is directly coupled to a first surface of the housing; and
    a first thermal conductive plate disposed between the first semiconductor device and the housing, wherein the first thermal conductive plate is thermally connected to the housing,
    wherein at least a part of the first fixing unit and the first thermal conductive plate each have a thermal conductivity that is greater than a thermal conductivity of the substrate,
    wherein the first thermal conductive plate is spaced apart from the substrate,
    wherein the first thermal conductive plate is fixed on the first fixing unit in a spaced-apart relationship with the substrate,
    wherein the housing further comprises a second fixing unit coupled to a second surface of the housing that is different from the first surface of the housing, the device further comprising a second thermal conductive plate fixed on the second fixing unit, wherein at least a major portion of the second thermal conductive plate is spaced apart from the second surface of the housing.

12. The storage device of claim 11, wherein the second thermal conductive plate is curved convexly toward the first thermal conductive plate.

13. The storage device of claim 12, wherein the housing comprises:
    a first sub-housing comprising the first fixing unit; and
    a second sub-housing comprising the second fixing unit,
    wherein the second thermal conductive plate elastically contacts the first thermal conductive plate when the second sub-housing is coupled to the first sub-housing.

14. A storage device comprising:
    a semiconductor device and an electronic device mounted on a substrate;
    a housing accommodating the substrate;
    a thermal conductor in thermal communication with the semiconductor device and the housing and configured to transfer heat generated by the semiconductor device to the housing; and
    a heat insulating feature configured to insulate the electronic device from heat generated by the semiconductor device,
    wherein:
       the thermal conductor comprises a thermally conductive plate coupled to the housing, wherein the thermally conductive plate is spaced apart from the substrate; and the heat insulating feature comprises an opening in the thermally conductive plate that is aligned with the electronic device.

15. The storage device of claim 14, wherein:

the thermal conductor comprises a heat transfer medium disposed between the semiconductor device and the thermally conductive plate; and the heat insulating feature comprises the electronic device being spaced apart from the thermally conductive plate.

\* \* \* \* \*